United States Patent
Park et al.

(10) Patent No.: US 7,813,186 B2
(45) Date of Patent: Oct. 12, 2010

(54) FLASH MEMORY DEVICE AND PROGRAMMING METHOD THEREOF

(75) Inventors: Seong Hun Park, Gunsan-si (KR); Jong Hyun Wang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 150 days.

(21) Appl. No.: 12/130,955

(22) Filed: May 30, 2008

(65) Prior Publication Data

US 2009/0141560 A1    Jun. 4, 2009

(30) Foreign Application Priority Data

Nov. 29, 2007   (KR) .................... 10-2007-0122568

(51) Int. Cl.
*G11C 7/10* (2006.01)
(52) U.S. Cl. ...................... 365/189.02; 365/189.05; 365/230.02; 365/230.08
(58) Field of Classification Search ............ 365/189.02, 365/189.05, 230.02, 230.08
See application file for complete search history.

(56) References Cited

U.S. PATENT DOCUMENTS

| 5,671,178 | A  | * | 9/1997 | Park et al. | ............... | 365/185.22 |
| 6,724,682 | B2 | * | 4/2004 | Lee et al.  | ............... | 365/230.06 |
| 6,998,873 | B2 | * | 2/2006 | Park        | ............... | 326/83     |
| 7,567,456 | B2 | * | 7/2009 | Zanardi et al. | .......... | 365/185.05 |

FOREIGN PATENT DOCUMENTS

KR    1020070082999 A    8/2007

* cited by examiner

*Primary Examiner*—Pho M Luu
(74) *Attorney, Agent, or Firm*—Townsend and Townsend and Crew LLP

(57) ABSTRACT

A flash memory device includes a memory cell array including a plurality of memory cells, a page buffer unit including a plurality of page buffers connected to bit lines of the memory cell array, a data line mux unit connected between the page buffer unit and a data line and configured to receive verification data through a page buffer during a verify operation. The flash memory device also includes a fail bit counter unit for counting the verification data, comparing counted fail bits and the number of ECC allowed bits, and outputting a pass or fail signal of a program operation according to the comparison result.

16 Claims, 4 Drawing Sheets

FLASH MEMORY DEVICE AND PROGRAMMING METHOD THEREOF

CROSS-REFERENCES TO RELATED APPLICATIONS

The present application claims priority to Korean patent application number 10-2007-122568, filed on Nov. 29, 2007, which is incorporated by reference in its entirety.

BACKGROUND OF THE INVENTION

The present invention relates to a flash memory device and programming method thereof and, more particularly, to a flash memory device and programming method thereof, in which a verify operation can be executed during a program operation.

In recent years, there has been an increasing demand for semiconductor memory devices which can be electrically programmed and erased without a refresh function of rewriting data at regular intervals. Active research has also been conducted to develop high integration memory devices and large-capacity memory devices that can store a large amount of data.

For a high integration memory cell, a NAND type flash memory device has been developed in which a plurality of memory cells are connected in series to constitute a string. The NAND type flash memory device is programmed or erased by injecting or draining electrons into or out of the floating gate of the NAND type flash memory device by the Fowler-Nordheim Tunneling method.

The NAND type flash memory device employs a page buffer to store a large capacity of information in short bursts and to verify whether data has been normally programmed or erased. The page buffer generally includes a single register for temporarily storing data. Recently, the page buffer has been expanded to include a dual register to increase data program speed.

FIG. 1 is a block diagram of a page buffer having a dual register structure of a general NAND type flash memory device. A program operation and a copyback operation are performed using a main register 24 and a cache register 25, respectively. The main register 24 is used to execute read and program erase verify operations. An operation of the page buffer upon program verification is described below.

If discharge signals DISCHe, DISCHo are applied to a verify signal supply unit 21, a verify signal VIRPWR, which maintains a voltage level of 0V, is applied to one of even and odd bit lines BLe, BLo. The main register 24 includes a latch 27. An output node of the latch 27 is reset in response to a reset signal. If a precharge signal of a low level is applied to a precharge unit 23, a power supply voltage Vcc is supplied to a sense node SO, which maintains a high level. Thereafter, an even bit line select signal BSLe having a voltage level of a first voltage V1 is applied to a bit line select unit 22 and, therefore, the even bit line BLe is precharged to V1-Vt. The bit line select unit 22 is then applied with the even bit line select signal BSLe of a low level to evaluate the cell. The precharge signal of a high level is applied to the precharge unit 23, so that the node that supplies the sense node SO with the power supply voltage Vcc is blocked. Hence, the bit line select unit 22 is applied with the even bit line select signal BSLe having a voltage level of a second voltage V2. Thereafter, the main register 24 is applied with a read signal and, therefore, the voltage levels of the input and output nodes of the latch 27 are changed according to the voltage level of the sense node SO, which is changed according to the programmed or erased state of the cell. That is, in the case of a programmed cell, the sense node SO maintains a high voltage level, and in the case of the erased cell, the sense node SO is discharged to a low voltage level. When the sense node SO maintains a high voltage level, the voltage level of the input node of the sense node SO becomes a low level and the output node thereof becomes a high level. A detection signal terminal floats due to the high voltage level of the output node. Meanwhile, when the sense node SO maintains a low voltage level, the voltage levels of the input node and the output node of the sense node SO are not changed, so the output node maintains a low voltage level. The voltage level of the detection signal becomes a high level due to the low voltage level of the output node. Accordingly, in the case of a programmed cell, the voltage level of the detection signal floats, and in the case of an erased cell, the voltage level of the detection signal becomes a high level.

One page buffer, constructed as described above, is coupled to each bit line pair (i.e., an even bit line and an odd bit line) of a flash memory device. Further, as shown in FIG. 2, detect signal nodes nWDO_L of each page buffer are bound to one line and output. In other words, in the case of a flash memory device comprised of 512 bit lines, 512 detect signal nodes nWDO_L from 512 page buffers are integrated into one line and output. Thus, since a 1-bit detection signal nWDO is output on a 512-page-buffer basis, pass or fail bits are produced using a 16-bit detection signal nWDO.

The conventional verify method of the flash memory device can check only a pass or fail state, but cannot check how many fail bits have occurred.

BRIEF SUMMARY OF THE INVENTION

The present invention is directed toward a flash memory device and programming method thereof in which during a program operation of the flash memory device, data is programmed into the flash memory device. A column scanning operation for verifying the data is then performed to check bits where program failures have occurred and to count the number of fail bits. Fail bits are corrected using an ECC (Error correction code), thus enhancing the efficiency of the flash memory device.

In an embodiment of the present invention, a flash memory device includes a memory cell array including a plurality of memory cells; a page buffer unit including a plurality of page buffers connected to bit lines of the memory cell array; a data line mux unit connected between the page buffer unit and a data line and configured to receive verification data through a page buffer during a verify operation; and a fail bit counter unit for counting the verification data, comparing counted fail bits and the number of ECC allowed bits, and outputting a pass or fail signal of a program operation according to the comparison result.

The page buffer unit may be configured to read data programmed into the memory cell during the verify operation and store the read data as the verification data.

The fail bit counter unit may further include a first comparator for comparing the verification data and input data, which is input during the program operation; a counter for counting output signals of the first comparator and outputting the counted output signals as a counting signal; a register for storing the number of ECC allowed fail bits; and a second comparator for comparing the number of ECC allowed fail bits and the counting signal, and outputting the pass or fail signal.

The data line mux unit may include a column decoding unit for selecting any one of the plurality of page buffers in response to a column address during the verify operation, and a data line mux unit for receiving the verification data from the column decoding unit during the verify operation and outputting the received verification data to the fail bit counter unit.

In another embodiment of the present invention, a programming method of a flash memory device includes inputting a plurality of program data to a plurality of page buffers connected to a memory cell array, respectively; programming the plurality of program data into the memory cell array; verifying the plurality of data programmed into the memory cell array and outputting a plurality of verification data; counting fail bits by employing the plurality of verification data; comparing the number of the counted fail bits and the number of allowed bits; and outputting a program pass or fail signal.

When the number of the counted fail bits is greater than the number of the allowed bits, the fail signal is output, and when the number of the counted fail bits is identical to or smaller than the number of the allowed bits, the pass signal is output.

In still another embodiment of the present invention, a programming method of a flash memory device includes inputting a first program data to a page buffer; programming the first program data into a memory cell array and at essentially the same time, inputting a second program data to the page buffer; verifying the first program data programmed into the memory cell array; outputting verification data; counting the number of fail bits by employing the verification data; comparing the number of the counted fail bits and the number of allowed bits; and outputting a program pass or fail signal according to the comparison result.

When the number of the counted fail bits is greater than the number of the allowed bits, the fail signal is output, and when the number of the counted fail bits is identical to or smaller than the number of the allowed bits, the pass signal is output.

The first program data may be input to the page buffer through a selected data line in response to a column address.

In the counting of the fail bits, up to the verification data corresponding to a last column address may be output by sequentially increasing the column address, and data on which the program operation is not normally performed is counted as the fail bits.

The output of the program pass or fail signal may be performed after an operation in which the second program data is input to the page buffer is completed.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the appended claims.

Figure 1:
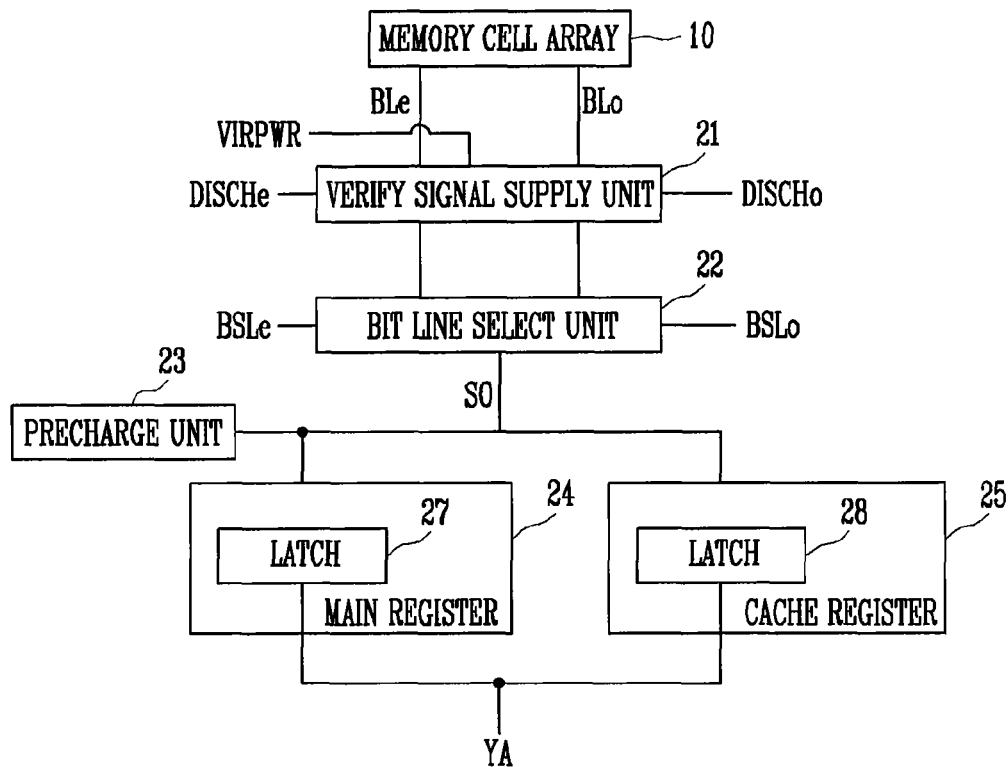
FIGS. 1 and 2 illustrate a conventional pass or fail verify operation of a flash memory device.
Figure 2:
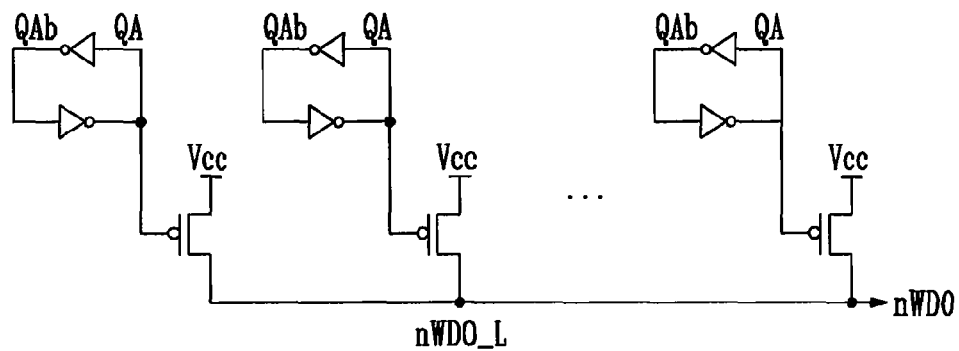
Figure 3:
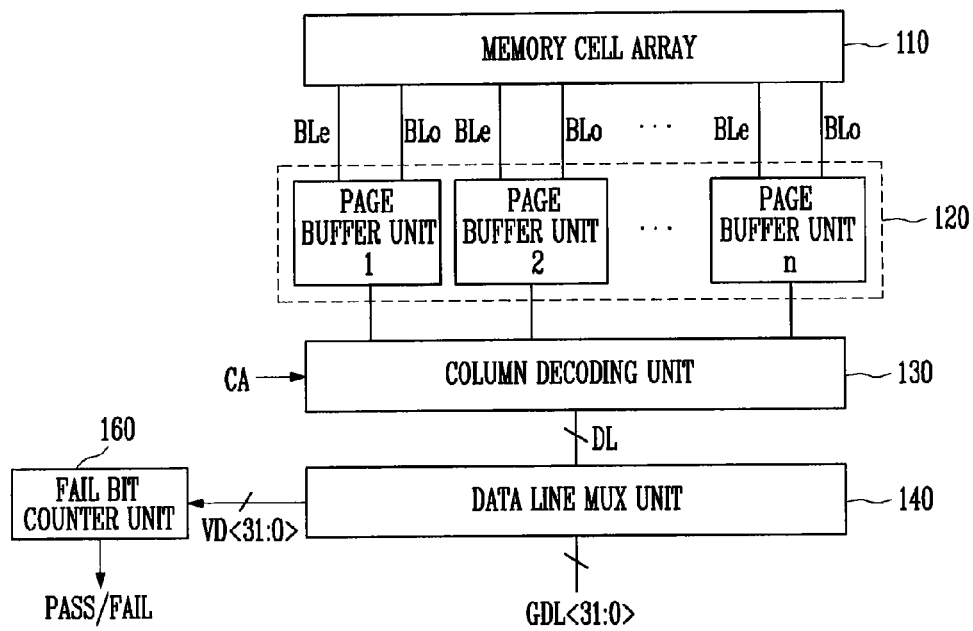
FIG. 3 is a block diagram of a flash memory device according to an embodiment of the present invention.

FIG. 3 is a block diagram of a flash memory device according to an embodiment of the present invention.

Referring to FIG. 3, a flash memory device includes a memory cell array 110, a page buffer unit 120, a column decoding unit 130, a data line mux unit 140, and a fail bit counter unit 160.

The memory cell array 110 includes a plurality of strings. In each string a plurality of memory cells are connected in series. One string may include 16 or 32 memory cells, a drain select transistor and a source select transistor. The drain select transistor has a drain region coupled to bit lines BLe, BLo, and the source select transistor has a source region coupled to a common source line.

The page buffer unit 120 includes a plurality of page buffers (page buffer 1 to page buffer n)). Each page buffer is coupled to a bit line (Ble, BLo) pair of the memory cell array 110.

The column decoding unit 130 is connected to the page buffer unit 120. The column decoding unit 130 connects a data line DL and any one of the plurality of page buffers (page buffer 1 to page buffer n) in response to a column address CA.

The data line mux unit 140 connects a global data line GDL and the data line DL during a programming or read operation of the device. The data line mux unit 140 outputs verification data VD<31:0>, which is input through the data line DL, to the fail bit counter unit 160 during a verify operation of the device.

The fail bit counter unit 160 counts fail bits of the verification data VD<31;0>, which is input from the data line mux unit 140, during a verify operation of the flash memory device. The fail bit counter unit 160 compares the number of counted fail bits and the number of fail bits allowed in an ECC unit. As a result of the comparison, when the number of the counted fail bits is greater than the number of fail bits allowed in the ECC unit, the fail bit counter unit 160 outputs a fail signal FAIL. However, when the number of the counted fail bits is identical to or smaller than the number of fail bits allowed in the ECC unit, the fail bit counter unit 160 outputs a pass signal PASS.

Figure 4:
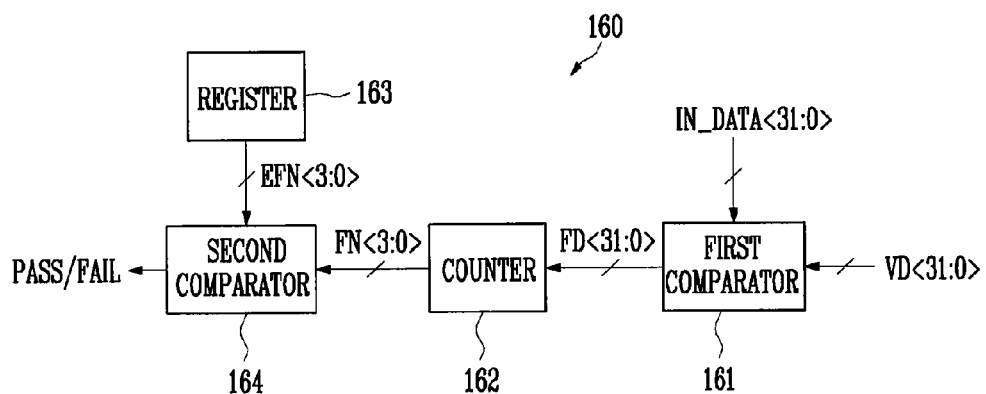
FIG. 4 is a detailed block diagram of a counter unit shown in FIG. 3.

FIG. 4 is a detailed block diagram of the fail bit counter unit 160 shown in FIG. 3.

Referring to FIG. 4, the fail bit counter unit 160 includes a first comparator 161 for comparing the verification data VD<31:0> and input data IN_DATA<31:0> input during a program operation, a counter 162 for counting output signals FD<31:0> of the first comparator 161 and outputting counted signals as counting signals FN<3:0>, a register 163 for storing the number of ECC allowed fail bits, and a second comparator 164 for comparing the number of ECC allowed fail bits EFN<3:0> stored in the register 163 and the counting signals FN<3:0>, and outputting a pass or fail signal PASS or FAIL.

The register 163 may be a fuse set and may store the number of ECC allowed fail bits according to the threshold of a fuse of the fuse set.

Figure 5:
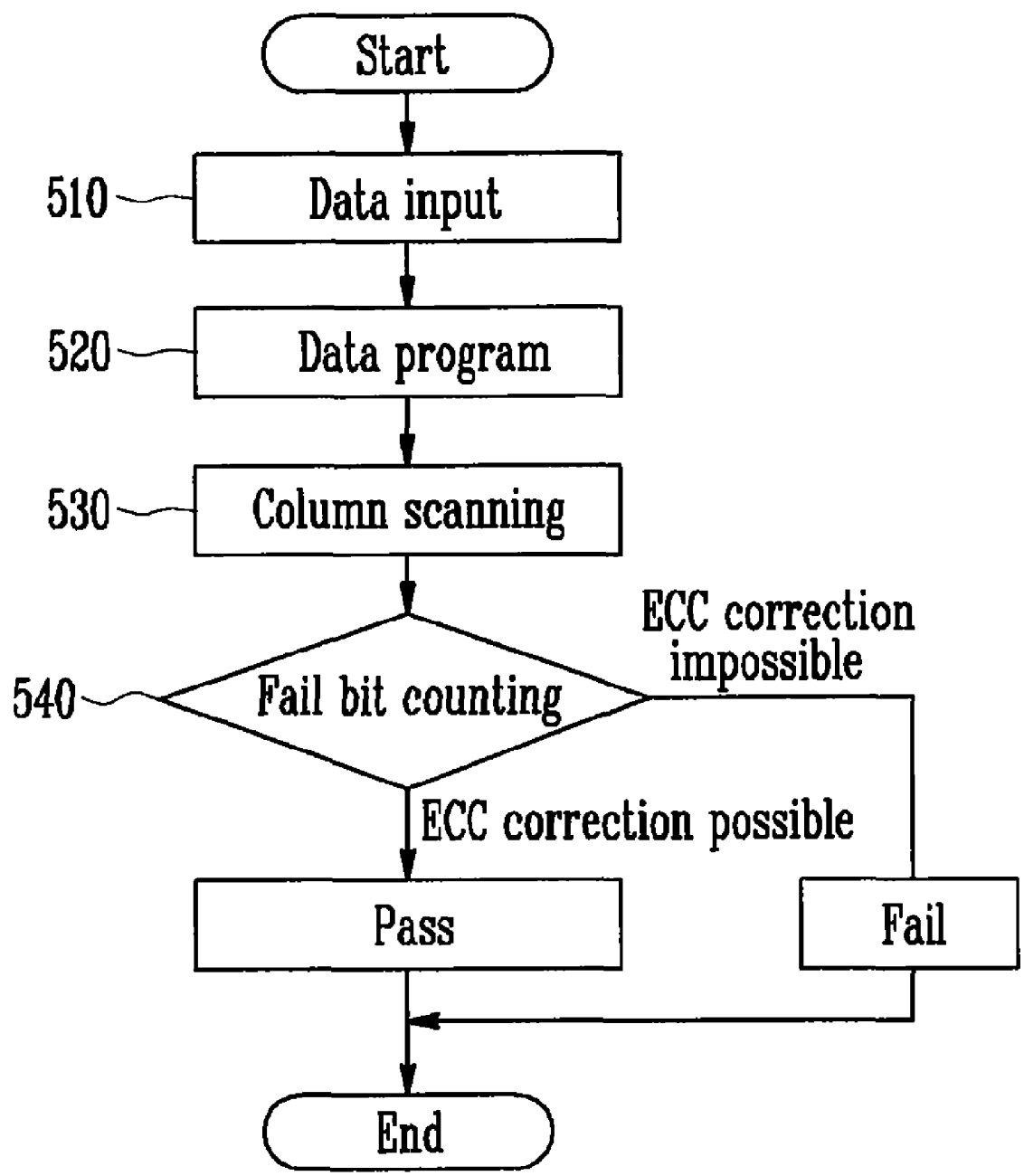
FIG. 5 is a flowchart illustrating a pass or fail verify operation of a flash memory device according to an embodiment of the present invention.

FIG. 5 is a flowchart illustrating a verify operation of a flash memory device according to an embodiment of the present invention.

A verify operation of a flash memory device is described below with reference to FIGS. 3 to 5.

1) Data Input Step (510)

When the flash memory device is programmed, program data is input to the column decoding unit 130 through the global data line GDL and the data line DL. Hence, a column address of a column to be programmed is input and one page buffer (any one of page buffer 1 to page buffer n) of the page buffer unit 120 is connected to the data line DL, so the program data is input to the page buffer unit 120.

2) Data Program Step (520)

The program data input to the page buffer unit 120 is transferred through a selected bit line (any one of BLe, BLo). Hence, a program voltage is applied to a word line connected to a selected memory cell of the memory cell array 110, so that the program data is programmed into the selected memory cell.

3) Column Scanning Step (530)

To perform a verify operation of the programmed memory cell, the state (verification data) of the memory cell is read and then stored in a page buffer (any one of page buffer 1 to page buffer n).

The column address applied when the program data is input is then applied to the column decoding unit 130, so that the verification data is output to the data line mux unit 140. The data line mux unit 140 determines pass or failure of the verification data, and at the time of failure as a result of the determination, outputs the verification data VD<31:0> to the fail bit counter unit 160.

4) Fail Bit Counting (540)

The first comparator 161 of the fail bit counter unit 160 compares the verification data VD<31:0>, which is input during the column scanning operation, and the input data IN_DATA, which is input during the program operation, and outputs information about mismatching data as a result of the comparison (that is, data on which the program operation has not been normally performed) as the compare signal FD<31:0>.

The counter 162 receives the compare signal FD<31:0>, counts the data on which the program operation has not been normally performed, and outputs the counting signal FN<3:0>. The second comparator 164 compares the number of ECC allowed fail bits EFN<3:0>, which is stored in the register 163, and the counting signal FN<3:0>, and outputs the pass or fail signal PASS or FAIL according to the comparison result.

As described above, after program data is programmed into a memory cell, the program operation is verified using a column scanning method by reading the programmed data. Accordingly, the number of fail bits during a program operation of a plurality of memory cells is counted and the pass or fail signal PASS or FAIL is then output.

Another embodiment of the present invention is described below using a cache program of a program operation of a flash memory device as an example.

Figure 6:
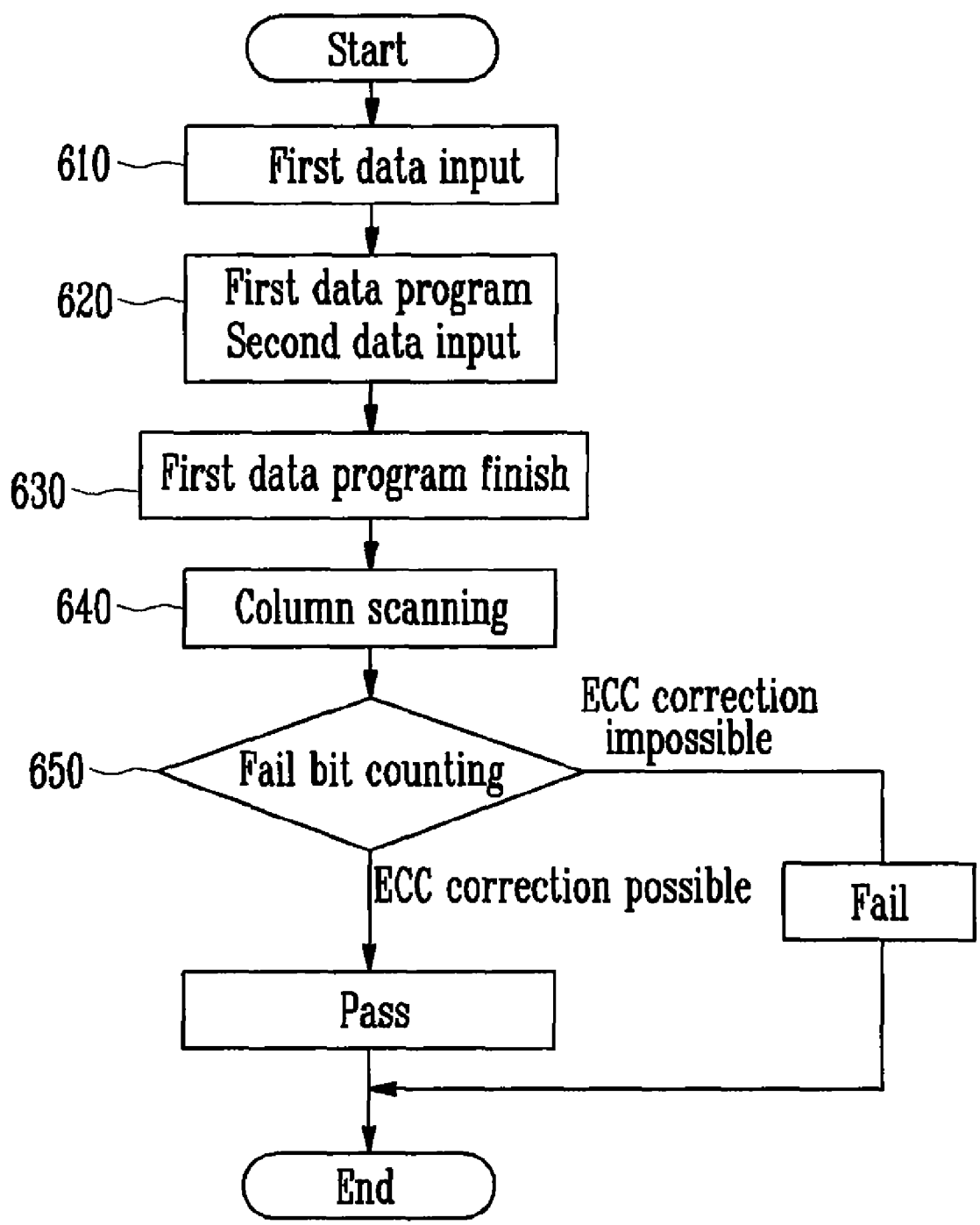
FIG. 6 is a flowchart illustrating a pass or fail verify operation of a flash memory device according to another embodiment of the present invention.

FIG. 6 is a flowchart illustrating a verify operation of a cache program operation of a flash memory device according to another embodiment of the present invention.

1) First Data Input Step (610)

When a cache program is executed on a flash memory device, first data is input to the column decoding unit 130 through the global data line GDL and the data line DL. Hence, a column address of a column to be programmed is input and therefore one page buffer (any one of page buffer 1 to page buffer n) of the page buffer unit 120 is connected to the data line DL, so the first data is input to the page buffer unit 120.

2) First Data Program and Second Data Input Step (620)

The first data input to one page buffer (any one of page buffer 1 to page buffer n) of the page buffer unit 120 is transferred to a memory cell to-be-programmed, through the bit line BLe or BLo of the memory cell array 110. Hence, a program voltage is applied to a word line of the memory cell to-be-programmed, so the memory cell is programmed. At the same time, a second data is input to the page buffer unit 120 in the same manner that the first data is input.

3) First Data Program Finish (630)

If the program voltage is applied for a predetermined time interval and the memory cell is programmed, the program voltage is blocked and therefore the program operation of the cell is finished.

4) Column Scanning Step (640)

To perform a verify operation of the programmed memory cell, the state (verification data) of the memory cell is read and then stored in a page buffer (any one of the page buffer 1 to the page buffer n).

The column address applied when the program data is input is then applied to the column decoding unit 130, so that the verification data is output to the data line mux unit 140. The data line mux unit 140 determines pass or failure of the verification data, and at the time of failure as a result of the determination, outputs the verification data VD<31:0> to the fail bit counter unit 160.

5) Fail Bit Counting (650)

The first comparator 161 of the fail bit counter unit 160 compares the verification data VD<31:0>, which is input during the column scanning operation, and the input data IN_DATA, which is input during the program operation, and outputs information about mismatching data as a result of the comparison (that is, data on which the program operation has not been normally performed) as the compare signal FD<31:0>.

The counter 162 receives the compare signal FD<31:0>, counts the data on which the program operation has not been normally performed, and outputs the counting signal FN<3:0>. The second comparator 164 compares the number of ECC allowed fail bits EFN<3:0>, which is stored in the register 163, and the counting signal FN<3:0> and outputs the pass or fail signal PASS or FAIL according to the comparison result.

When the pass signal PASS is output, error of program fail cells of the flash memory device can be corrected using an ECC circuit.

After the first column scanning operation is finished, the second data is input to the column decoding unit 130 through the global data line GDL and the data line DL. Hence, a column address of a column to be programmed is input and therefore one page buffer (any one of page buffer 1 to page buffer n) of the page buffer unit 120 is connected to the data line DL, so the second data is input to the page buffer unit 120.

The second data input to one page buffer (any one of page buffer 1 to page buffer n) of the page buffer unit 120 is transferred to a memory cell to-be-programmed, through the bit line BLe or BLo of the memory cell array 110. Hence, a program voltage is applied to a word line of the memory cell to-be-programmed, so that the memory cell is programmed. At the same time, a third data is stored in the page buffer unit 120 in the same manner that the first or second data is input.

A verify operation is then performed on the second data and a second column scanning operation is executed accordingly. The above column scanning operation is sequentially executed by increasing the address up to the last column.

As described above, according to an embodiment of the present invention, during a program operation of a flash memory device, data is programmed into the flash memory device, a column scanning operation for verifying the data is then performed to check bits where program failures have occurred and count the number of fail bits, and fail bits are corrected using an ECC. Accordingly, the efficiency of the flash memory device can be enhanced.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the appended claims.

What is claimed is:

1. A flash memory device comprising:
    a memory cell array including a plurality of memory cells;
    a page buffer unit including a plurality of page buffers connected to bit lines of the memory cell array;
    a data line mux unit connected between the page buffer unit and a data line, and configured to receive verification data through a page buffer during a verify operation; and
    a fail bit counter unit connected to the data line mux unit, wherein the fail bit counter unit counts fail bits generated by whether or not the verification data outputted from the data line mux unit is consistent with input data input during a program operation and outputs a pass signal or a fail signal generated by whether or not the counted number of fail bits is greater than a number of fail bits that can be corrected by an error correction code (ECC).

2. The flash memory device of claim 1, wherein the page buffer unit is configured to read data programmed into the memory cell during the verify operation and store the read data as the verification data.

3. The flash memory device of claim 1, wherein the fail bit counter unit further comprises:
    a first comparator for comparing the verification data and the input data;
    a counter for counting output signals of the first comparator and outputting the counted output signals as a counting signal;
    a register for storing the number of ECC allowed fail bits; and
    a second comparator for comparing the number of ECC allowed fail bits and the counting signal, and outputting the pass or fail signal.

4. The flash memory device of claim 3, wherein the second comparator outputs the fail signal when the number of the counted fail bits is greater than the number of the allowed bits, and outputs a pass signal when the number of the counted fail bits is identical to or smaller than the number of the allowed bits.

5. The flash memory device of claim 3, wherein the register is a fuse, the register storing the number of ECC allowed fail bits according to a threshold of the fuse.

6. The flash memory device of claim 1, wherein the data line mux unit comprises:
    a column decoding unit for selecting any one of the plurality of page buffers in response to a column address during the verify operation; and
    a data line mux unit for receiving the verification data from the column decoding unit during the verify operation and outputting the received verification data to the fail bit counter unit.

7. A programming method of a flash memory device, comprising:
    inputting a plurality of program data to a plurality of page buffers connected to a memory cell array, respectively;
    programming the plurality of program data into the memory cell array;
    verifying the plurality of data programmed into the memory cell array;
    outputting a plurality of verification data;
    counting fail bits by employing the plurality of verification data;
    comparing the number of the counted fail bits and the number of allowed bits; and
    outputting a program pass or fail signal.

8. The programming method of claim 7, wherein when the number of the counted fail bits is greater than the number of the allowed bits, the fail signal is output, and when the number of the counted fail bits is identical to or smaller than the number of the allowed bits, the pass signal is output.

9. The programming method of claim 7, wherein the program data is input to the corresponding page buffer through a selected data line in response to a column address.

10. The programming method of claim 9, wherein up to the verification data corresponding to a last column address is output by sequentially increasing the column address, and data on which the program operation is not normally performed is counted as the fail bits.

11. A programming method of a flash memory device, comprising:
    inputting a first program data to a page buffer;
    programming the first program data into a memory cell array and at essentially the same time, inputting a second program data to the page buffer;
    verifying the first program data programmed into the memory cell array;
    outputting verification data;
    counting the number of fail bits by employing the verification data; and
    comparing the number of the counted fail bits and the number of allowed bits; and
    outputting a program pass signal or a program fail signal according to the comparison result.

12. The programming method of claim 11, wherein when the number of the counted fail bits is greater than the number of the allowed bits, the fail signal is output, and when the number of the counted fail bits is identical to or smaller than the number of the allowed bits, the pass signal is output.

13. The programming method of claim 11, wherein the first program data is input to the page buffer through a selected data line in response to a column address.

14. The programming method of claim 13, wherein up to the verification data corresponding to a last column address is output by sequentially increasing the column address, and data on which the program operation is not normally performed is counted as the fail bits.

15. The programming method of claim 11, further comprising:
    programming the second program data into a memory cell array; and
    verifying the second program data programmed into the memory cell array.

16. The programming method of claim 11, wherein the output of the program pass or the program fail signal is performed after completion of inputting the second program data to the page buffer.

* * * * *